United States Patent [19]

Molva et al.

[11] Patent Number: 5,440,579
[45] Date of Patent: Aug. 8, 1995

[54] COMPACT ELECTRON GUN HAVING A MICRODOT ELECTRON SOURCE AND A SEMICONDUCTOR LASER USING SAID GUN FOR ELECTRONIC PUMPING

[76] Inventors: Engin Molva, 8 Place Jean Moulin, 38000 Grenoble, France; Roger Accomo, 26 les Iris, 38420 le Versoud, France

[21] Appl. No.: 162,067
[22] PCT Filed: Apr. 8, 1993
[86] PCT No.: PCT/FR93/00353
    § 371 Date: Dec. 9, 1993
    § 102(e) Date: Dec. 9, 1993
[87] PCT Pub. No.: WO93/21646
    PCT Pub. Date: Oct. 28, 1993

[30] Foreign Application Priority Data

Apr. 10, 1992 [FR] France .................. 92 04430

[51] Int. Cl.$^6$ .............................................. H01S 3/097
[52] U.S. Cl. .............................................. 372/87; 372/74
[58] Field of Search .................. 372/75, 74, 69, 70, 372/92

[56] References Cited

U.S. PATENT DOCUMENTS 3,803,510  4/1974  Nicoll .
5,125,000  6/1992  Labrunie et al. .................. 372/74

FOREIGN PATENT DOCUMENTS 0119646  2/1983  European Pat. Off. .
0379325  1/1989  European Pat. Off. .
0454566  4/1990  European Pat. Off. .

Primary Examiner—Leon Scott, Jr.

[57] ABSTRACT

Compact electron gun having a microdot electron source and a semiconductor laser using said gun for electronic pumping. A compact electron gun is provided having a microdot electron emitting source (2), an anode (8) spaced from the microdots, means (16) for applying a high voltage to the and, array (10) of electrodes distributed around the bean emitted by the source for the strip focussing thereof onto the anode. The array also serves as an electrostatic screen for the source with respect to the high voltage of the array. The array is positioned between the source and the anode and has at least two pairs of electrodes (18, 18b, 20a, 20b) of different dimensions which are raised to respectively positive and negative voltages. The positive and the negative voltages produce a weak electrostatic field between the source and the electrode array and a strong electrostatic field between the electrode array and the anode. The electron gun also has means for applying a medium voltage to the electrode array and means for applying an appropriate voltage to the microdots.

11 Claims, 7 Drawing Sheets

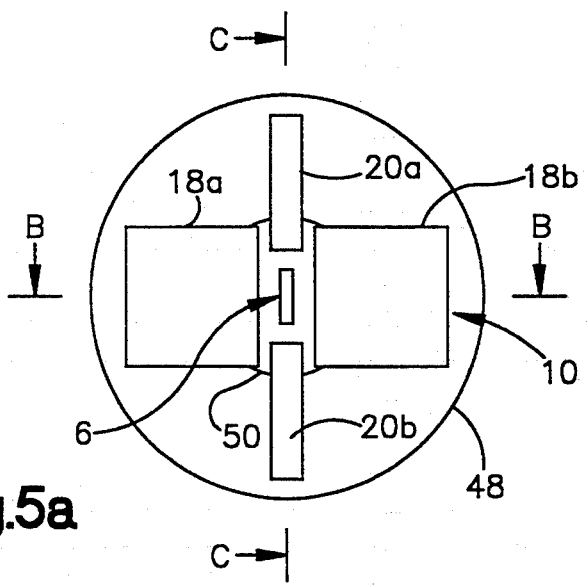
Fig.5a
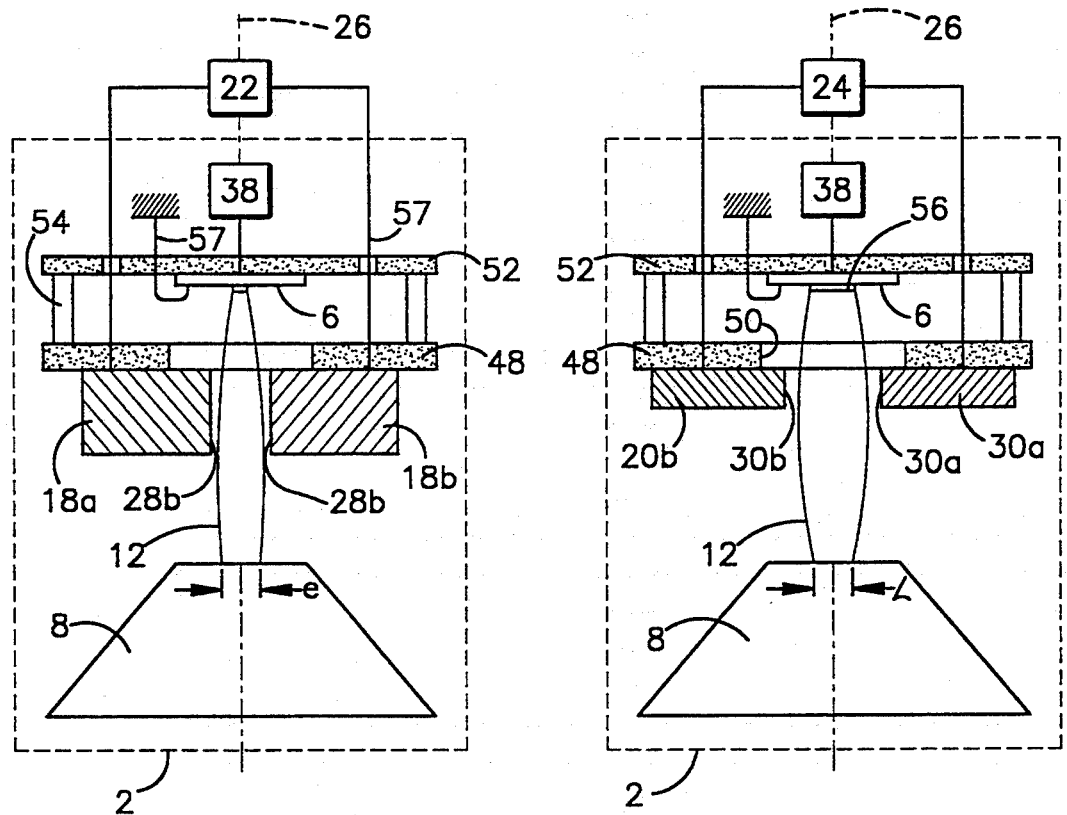
Fig.5b
Fig.5c

COMPACT ELECTRON GUN HAVING A MICRODOT ELECTRON SOURCE AND A SEMICONDUCTOR LASER USING SAID GUN FOR ELECTRONIC PUMPING

BACKGROUND OF THE INVENTION

The present invention relates to a compact electron gun having a cold microdot electron source.

In general terms, the electron gun according to the invention has a cold microdot electron source, a simplified electronic optics compared with known electron guns, as well as a high voltage anode bombarded by the electrons from the cold source. The source-optic-anode assembly is compact and has a volume of a few cubic centimeters.

This electron gun can be used in a semiconductor laser as an electronic pumping means.

A microdot semiconductor laser or MSL is constituted by a semiconductor source as the active medium and a compact microdot electron gun as the pumping means. This structure can be constituted by a solid semiconductor material, thin film semiconductor materials or a heterostructure.

The use of the electron gun according to the invention makes it possible to improve the performance characteristics of the semiconductor laser and in particular makes it possible to obtain an operation with a weak electronic current, an improvement of the laser efficiency, a limitation of thermal problems, an increase in the life of the pumping means, and a better overall reliability of the laser. These improvements are obtained through modifying and optimizing the compact electron gun according to the invention.

A MSL type laser in particular makes it possible to emit a visible laser light from 0.4 to 0.6 $\mu$m, which has numerous applications. Thus, such a laser can be used for the optical recording and reading of information, such as on audio and video compact disks (CD-ROM's—compact disks-read only memories), WORM's (one write-several reads), erasable memories (of the magnetooptical type or phase change type) or in laser printers.

It can also have other applications such as, for example, bar code readers, laboratory instrumentation, spectroscopy, biomedical instrumentation, pointers, spectacles, display by projection, submarine communications, etc.

The compact electron gun according to the invention can also be used in fields other than that of lasers and in general terms in any device where it is necessary to have electrons accelerated with high voltages (typically 0 to 40 kV), which are focussed and in which everything is assembled in a compact manner (typically a few $cm^3$). For example, it is possible to use the electron gun according to the invention in a X-ray generator.

For the optical recording and reading of information, the compact laser using the electron gun according to the invention makes it possible to increase the recording density and simplify the optical instrumentation. In laser printers, the compact laser using the electron gun according to the invention permits a better definition of the image and an increase in the printing speed compared with known systems.

An electronic pumping-type compact semiconductor laser using an electron gun with a microdot source is described in FR-A-2 661 566 filed in the name of the applicant. This laser has a laser cavity equipped with a semiconductor heterostructure, which is the laser active medium. This heterostructure forms an anode raised to a high voltage and which is bombarded with high-energy electrons supplied by a compact gun.

Electronic pumping-type lasers are used in cases where the semiconductor materials chosen do not make it possible to produce injection laser diodes and when there is no compact optical pumping source.

The advantages of a MSL compared with injection laser diodes is in particular the separation of the functions the pumping elements and laser cavity.

In injection laser diodes (the only commercially available compact lasers), these basic functions (pumping and cavity) are produced on the semiconductor by appropriate P and N-type electrical dopings of the different epitaxied layers and by ohmic contacts.

The different manufacturing operations for obtaining these diodes make it necessary to perfectly control the technology of producing heterostructures and are generally only possible for certain semiconductors from the family of III-V compounds (of the type GaAlAs). This limits the wavelength range accessible to laser diodes to between 0.6 and 1.5 $\mu$m.

In MSL-type lasers, the injection of carriers (electrons and holes) which recombine in the active zone of the semiconductor for generating light emission, by definition takes place by an external source (electron gun) with respect to the active semiconductor medium. Consequently there is no need for a P or N-type doping of the different epitaxied layers of the laser. Electrical contacts are also unnecessary.

This greatly simplifies the metallurgy of the active semiconductor medium, where consideration is only necessary of the electrical confinement characteristics (electronic pumping/quantum wells), optical confinement characteristics (light guidance with a mode centred on the active zone) and the wavelength characteristics.

This advantage makes it possible to use in MSL's all direct gap semiconductors and in particular III-VI alloys based on Zn, Cd, Mn, Mg, Hg, S, Se and Te, where the doping and contact technologies are poorly or not mastered. These technologies become all the more problematical as the gap of the materials increases and therefore the emission wavelength is short. By their very design MSL's lead to the disappearance of these technological problems.

The possibility of using all direct gap semiconductors for MSL's gives accessibility to the wavelength range between the blue and the medium infrared. In particular, MSL's emitting in the blue-green make it possible to satisfy existing needs for all applications concerning optical recording. This range is not at present covered by injection laser diodes, which are the only commercially available compact lasers. Research is at present taking place for producing laser diodes emitting in the blue-green, either from II-VI semiconductors with the difficulties referred to hereinbefore, or using III-V laser diodes emitting in the infrared by frequency doubling or similar non-linear effects.

In the MSL known from FR-A-2 661 566, the focussing of the electrons on the active medium is essentially attributed to the conical or pyramidal shape of the anode. Moreover, use is made of strip focussing means for the electron beam. These means are constituted by two trapezoidal metal screens located on either side of the microdot source and close to the latter.

Focussing solely by the specific shape of the anode is not satisfactory, because it is not possible to control the dimensions or the shape of the focussing spots. The use of two metal screens only makes it possible to control one of the dimensions of the focussing strip.

Although imperfect focussing does not prevent the MSL from functioning, it requires a high operating current in order to achieve the laser threshold current density, which can cause thermal problems and a high stressing of the microdots, making them more vulnerable to breakdowns. In addition, imperfect focussing leads to the loss of part of the electronic pumping beam outside the useful area, which contributes to a reduction in laser efficiency.

Moreover, screens on either side of the source and close to the latter do not screen it from the anode, which is raised to a high voltage. Thus, the microdot cathodes are subject to the effect of the high voltage, that is the source is in a strong electric field zone, which could contribute to an unsatisfactory operation of the source, or could or could shorten its life. The problems referred to hereinbefore lead to a reduction in the performance characteristics and reliability of the known MSL.

SUMMARY OF THE INVENTION

The present invention relates to a novel compact electron gun equipped with a cold microdot electron source making it possible to obviate these disadvantages. In particular, this electron gun makes it possible to improve the performance characteristics of the laser. It more particularly permits the use of a lower current, a lower pumping power and a higher excitation density, that is better efficiency and reliability, a reduction of the thermal problems and the maintaining of the microdot source in a weak electrostatic field zone.

More specifically, the present invention relates to a compact electron gun having a cold electron source provided with cathode conductors supporting electron emitting microdots, a high voltage source spaced from the microdots and facing the latter, means for applying a high voltage to an anode, are an electrode array for focussing on the anode and in the form of a strip the electron beam emitted by the source. The array serves as an electrostatic screen for the source with respect to the high voltage applied to the anode. The array is interposed between the source and the anode and has at least two pairs of electrodes with different dimensions and respectively raised to positive and negative voltages, whereof their value is such that a weak electrostatic field is produced between the source and the electrode array and a strong electrostatic field is produced between the electrode array and the anode. The electrodes are distributed around the electron beam. The electrode gun also includes means for applying a medium voltage to the electrode array and means for applying an appropriate voltage to the cathode conductors.

The term "weak field" is understood to mean electrostatic fields at the most equal to 1000 V/cm, whereas "strong field" is understood to mean electrostatic fields of at least 2000 V/cm.

The cold microdot electron source makes it possible to bombard the anode with accelerated electrons between 0 and 40 kV.

Apart from the cathode conductors, the cold source has grid electrodes isolated from the cathode conductors. The cathode conductors and grid electrodes are respectively constituted by parallel bands, strips or tapes, with the cathode electrodes being perpendicular to the grid electrodes. The grid electrodes have holes facing the microdots.

The function of the microdot source is to emit electrons with a grid-cathode polarization of 80 to 150 V and the shape of the microdot array is significant with respect to the shape and dimensions of the focussing spot on the target, which is in this case the anode. Thus, the shape of the microdot array intervenes in the definition of the electronic optics.

For strip focussing, it is preferable to use e.g. a rectangular microdot array or network.

The function of the anode, raised to a high voltage by a high voltage power supply (0 to 40 kV) is to accelerate and collect the electrons emitted by the microdot source and focussed by the electrode array. The anode serving as a target for the electronic beam forms part of the electronic optics, because it also intervenes in the determination of the electric field lines and therefore the trajectories of the electrons. In particular, its shape can influence the equipotential lines and field lines.

The electronic optics have the following functions:

1). The focussing of the electrons in strip-like form and the control of the dimensions of the strip for its adaptation to the target (anode). In the case of a semiconductor laser, the width of the strip can be at a minimum and its length must be that of the width of the laser cavity (distance between the cleaved mirror faces of the Fabry-Perot cavity).

2). The separation into two electric field zones: strong field between the electrodes and the anode or laser cavity in the particular case of a MSL and weak field between the electrodes and the microdot source. Thus, the electrodes or electrostatic screens are raised to medium voltages of ±50 to ±800 V and are also positioned between the source and the anode.

This subdivision into two electric field zones, namely microdot source side-weak field (0.2 to 1 kV/cm) and anode side-strong field (2 to 10 kV/cm) has the effect of stabilizing the operation of the microdots, extending their life, in particular preventing accidental electrical breakdowns, and simplifying the shaping and focussing of the electron beam.

Moreover, the arrangement of the electrodes makes it possible to easily take into account thermal problems. Thus, the high-energy power received by the anode is equal to the product of the acceleration voltage and the electronic current. A large part (>50% in the case of MSL's) of the energy is transformed into heat and must be dissipated for satisfactory operation of the device. This energy received by the anode is minimized as a result of good focussing, which reduces the electronic current. The excess function is dissipated effectively to the outside by the anode.

The electronic optics (anode+electrodes) permits a strip focussing of typical width 5 to 150 $\mu$m and length 100 to 2000 $\mu$m.

Optionally and if necessary, the electrode array permits a scanning of the electron beam.

For a preliminary shaping of the electron beam, it is possible to use multiple electrodes at the grids of the microdot source, electromagnetic lenses or wire coils traversed by a current and surrounding the electron The strip focussing of the electrons, which is adapted to the shape of the anode and in particular a conical or pyramidal shape, makes it possible to reduce the electronic current for a given electronic current density. As a result there is less stressing of the microdot source and consequently its behaviour and life are improved. This also permits the reduction of the power deposited on the target for the same current density, so that the target is heated less. This is particularly important for a MSL. It also permits an increase in the current density for a given current. For the same excitation power, this makes it possible to improve the conversion efficiency (e.g. in the case of the laser the ratio of the laser power to the excitation power). This also makes it possible to achieve much higher excitation densities. It also permits an increase in the efficiency of the gun by a minimum loss of electrons to the exterior of the target.

The electron gun according to the invention described hereinbefore is particularly suitable for the electronic pumping of a semiconductor laser. The invention therefore also relates to an electronically pumped semiconductor laser, in which the pumping means is constituted by the electron gun according to the invention. The laser according to the invention can use as the active medium a solid semiconductor material, thin film semiconductor materials or a semiconductor heterostructure.

The performance characteristics of a heterostructure laser are significantly superior to those of a semiconductor laser made from solid material or thin films. Thus, use is advantageously made of a heterostructure laser.

BRIEF DESCRIPTION OF THE DRAWINGS

The invention is described in greater detail hereinafter relative to nonlimitative embodiments and with reference to the attached drawings, wherein show:

FIGS. 5a to 5c A first constructional variant of the electron gun according to the invention, FIG. 5a being a front view of the source-electrode assembly, FIG. 5b a view along section B—B of FIG. 5a and FIG. 5c a view along section C—C of FIG. 5a.

FIGS. 6a to 6c A second variant of the electron gun according to the invention, FIG. 6a being a plan view of the source-electrode assembly, FIG. 6b a view along section B—B in FIG. 6a and FIG. 6c a sectional view in direction C—C of FIG. 6a.

FIGS. 7a to 7c Diagrammatically a third variant of the electron gun according to the invention, FIG. 7a being a plan view of the source-electrode assembly, FIG. 7b a sectional view in direction B—B of FIG. 7a and FIG. 7c a sectional view in direction C—C of FIG. 7a.

DETAILED DESCRIPTION OF THE PREFERRED EMBODIMENT

Figure 1:
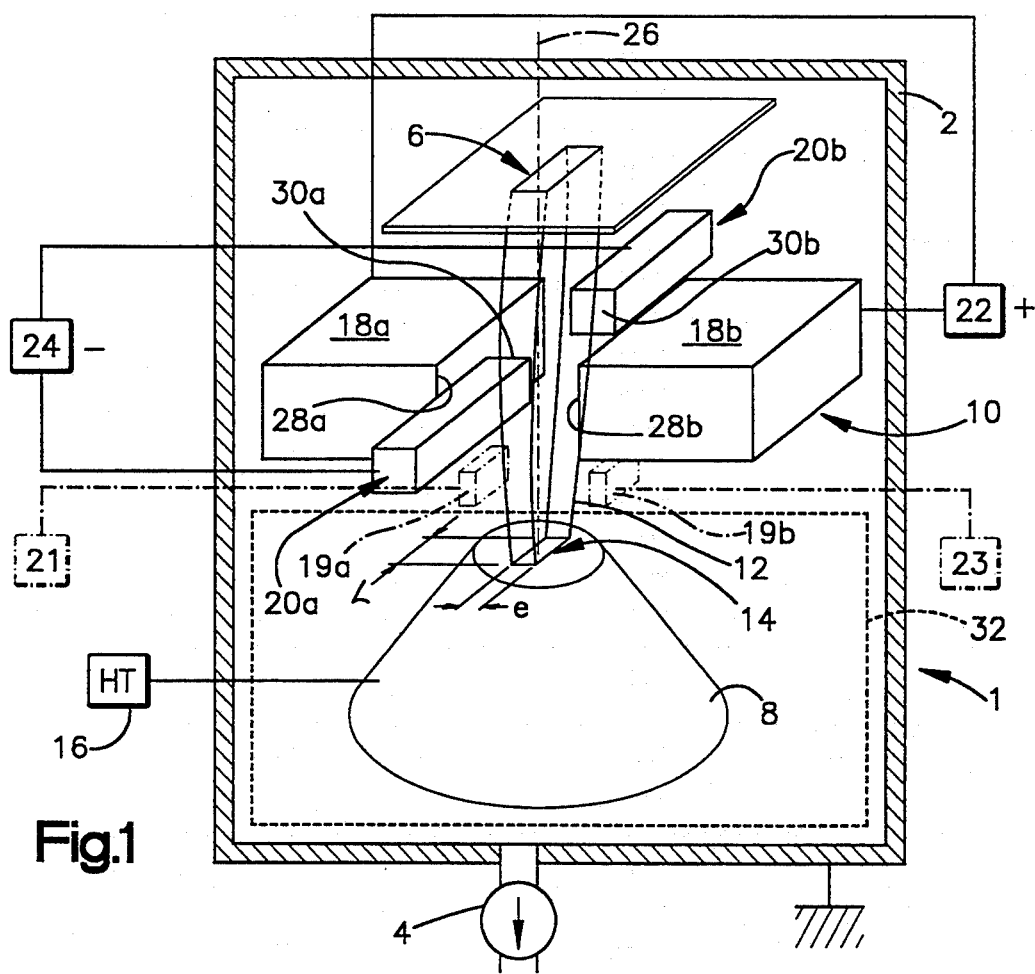
FIG. 1 Diagrammatically and in perspective the principle of the electron gun according to the invention.

The electron gun 1 according to the invention is a compact gun, whose assembly, with the exception of the electrical power supplies, is placed in a secondary vacuum or ultra-high vacuum enclosure 2 of a few cubic centimeters. This enclosure is equipped with a system of vacuum pumps 4 more particularly ensuring a high volume equal to or below $1.3 \times 10^3$ Pa (8 torrs). Instead of using an ultra-high vacuum enclosure, it is possible to assemble the different components of the electron gun in a tight, compact box.

The enclosure 2 or tight box of the electron gun must be designed so as to electrically "screen" the electron gun from the exterior. In addition, if the box or enclosure 2 is made from metal, it can be raised to earth potential. If it is insulating, its internal surfaces can be metallized and raised to earth or ground potential.

In the ultra-high vacuum enclosure 2, there is a cold microdot electron source 6, whose structure will be described in greater detail relative to FIG. 2, as well as a truncated cone or truncated pyramid-shaped, high voltage source 8. The top of the anode is oriented towards the source and arranged parallel to the emitting surface and at a certain distance from the latter.

The anode or target 8 is made from a solid metal, for example copper or molybdenum. Its height is typically 1 to 15 mm. The distance between the source and the anode is typically 5 to 20 mm.

Between the cold source 6 and the anode 8 there is an electrode array 10 for focussing onto the upper surface of the anode the electron bean 12 emitted by the cold source 6. This electrode array 10 is arranged so as to form a strip 14 on the upper surface of the anode and also serves as an electrostatic screen for the cold source so as to screen it from the high voltage applied to the anode 8 by means of the high voltage, electric power supply 16 outside the enclosure 2.

According to the invention, the electrode array 10 has at least two pairs of electrodes with different dimensions, namely a first electrode pair 18a, 18b and a second electrode pair 20a, 20b. The electrodes 18a, 18b are connected to the sane electric power supply 22 supplying a positive voltage with respect to the grids of the electron source and the electrodes 20a, 20b are connected to an electric power supply 24 supplying a negative voltage with respect to the grids of the source.

In order to create an electrostatic field which is symmetrical with respect to the axis of symmetry 26 of the electron gun and therefore the electron bean 12, the electrodes 18a, 18b are positioned symmetrically relative to said axis 26 and this also applies with regards to the electrodes 20a, 20b.

Electrodes 18a and 18b, raised to a positive potential with respect to the grids of the source, define and control the width 1 of the strip 14, whereas the electrodes 20a, 20b raised to the positive potential with respect to said grids, define and control its length L.

Moreover, the electrodes 18a have planar faces 28a, 28b which are parallel to one another and face the electron bean 12. The electrodes 20a, 20b have parallel faces 30a, 30b facing the bean 12. Therefore these faces 30a, 30b are perpendicular to the faces 28a, 28b.

Moreover, the length of the surfaces 28a, 28b is at least equal to that of the strip 14. In the sane way, the length of the faces 30a, 30b is at least equal to the with the width 1 of the strip 14.

In the embodiment shown in FIG. 1, the electrodes are shaped like rectangular parallelepipeds. These electrodes can be made from metal or a metallized electrical insulant. In addition, instead of using rectangular surfaces facing the electron bean 14, it is also possible to use other shapes which can be calculated by a numerical simulation. Generally, the shape is derived from a rectangle.

The electrode array 10 is obviously electrically insulated from the source 6 and the anode 8, for example it has no contact with said source and said anode. If necessary, the array 10 can ensure an electronic scanning of the bean 14. In this case, it is possible to supply the electrodes 18a, 18b with different voltages in order to displace the bean on the target 8 in the direction of the width 1. As shown in FIG. 1, it is also possible to use two supplementary electrodes 19a, 19b just below the electrodes 18a, 18b on the target side and raised to different potentials by means of external power supplies respectively 21 and 23.

Deflecting electrodes 19a, 19b will act on the position of the beam 12 on the target 8. Their function will be the same as that of deflect mg plates in a cathode ray tube (television, oscilloscope).

The distance separating the electrodes 18a and 18b is typically 2 to 10 mm and the distance separating the electrodes 20a and 20b is typically 5 to 10 mm. The height of the electrodes, measured along the axis 26, is typically 2 to 100 mm. The distance separating these electrodes from the source 6 is typically 0 to 10 mm.

The electron gun of FIG. 1 also has a radiator or cooler-type system 32 (Peltier component or low temperature cryostat) for controlling the temperature of the target 8 bombarded by the electron beam 12.

The electron gun according to the invention must be designed in such a way that it ensures the strip focussing of the beam 12 in accordance with a length L of 100 to 1000 μm and a width 1 of 5 to 150 μm. In the particular case of a laser with lateral confinement of the modes (cf. FIGS. 9a and 9b), the strip length must be of the same order of magnitude as that of the laser cavity.

Figure 2:
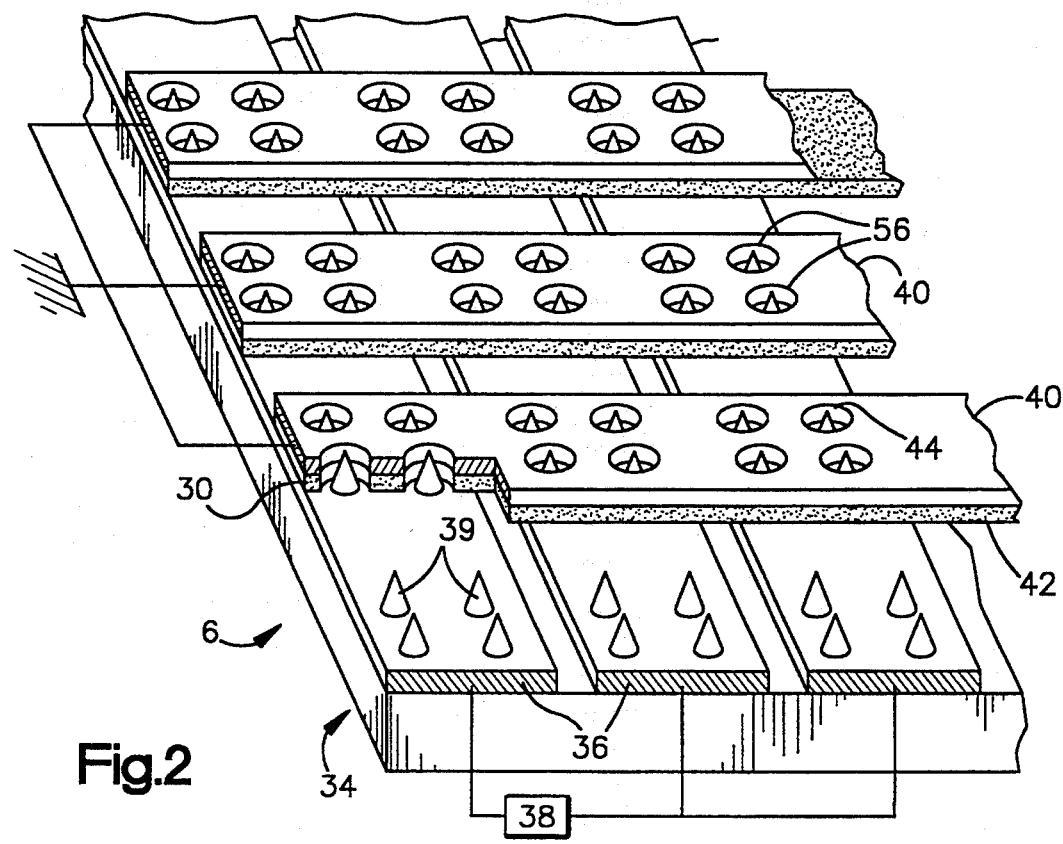
FIG. 2 In perspective, the cold microdot source of the electron gun of FIG. 1.

The microdot source 6 of the gun of FIG. 1 is shown in greater detail in FIG. 2. It is manufactured according to known microelectronics methods and in particular in accordance with FR-A-2 593 953 and FR-A-2 663 452.

It has an insulating substrate 34, which is generally of glass, which supports cathode conductors 36 in the form of parallel bands or strips and which is also parallel to a direction x. These cathode conductors are electrically connected to an electric power supply 38, which is negative with respect to earth or ground and which is positioned outside the enclosure 2 (FIG. 1). The cathodes 36 in particular have a width of 2 to 1000 μm and are separated by 2 to 1000 μm.

These cathodes 36 support microdots 39 made from a material (e.g. molybdenum) able to emit electrons. In particular they have a base diameter of approximately 1.5 μm and are spaced by 3 to 10 μm, which corresponds to 10000 to 100000 microdots per mm². Advantageously, the microdots define a rectangular matrix, whose length is typically 0.5 to 1.5 mm and whose width is typically 5 to 500 μm.

The source 6 also has grid electrodes 40 shaped like conductive strips perpendicular to the direction x. These grids 40 rest on electrically insulating strips 42 ensuring their electrical insulation relative to the cathodes 36. The grids 40 are generally raised to earth potential.

The insulating strips or bands 42 and the grid electrodes are stacked in coinciding manner. They, for examples have a width of 2 to 1000 μm and are for example, spaced by 2 to 1000 μm. The insulating strips 42 and the grids 40 are provided with through-holes 44 into which project the microdots 39.

The cathodes 36 and the grids 40 are made from a conductive metal, e.g. chromium, niobium, tungsten, molybdenum, etc. The electrical insulant 42 is in particular silicon oxide.

If necessary, it is possible to modify the shape of the grids 40, so that they define multiple grid electrodes for each elementary emission zone.

An operating example of the electron gun according to the invention will be given hereinafter.

The anode 8 is raised to a pulsed or d.c. positive voltage of typically 0 to 40 kV (0 to 10 kV in the case of a MSL). A potential difference of 80 to 150 V is created between the grids 40 and the microdots 39. For example, the grids are earthed and the microdots are at a negative potential. For modulated or pulsed operation, said potential can be modulated or pulsed with a typical breakdown frequency of approximately 1 MHz.

This potential difference between the grids and the microdots produces a high electric field of approximately $10^{+7}$ V/cm at the microdots. This field gives rise to the cold emission of electrons. The typical electronic current can be up to 1 microampere per microdot. For a 0.5 mm source on 1 mm of emitting surface having 7000 microdots, there is typically a current of 100 microamperes for a grid-cathode voltage of 80 volts.

The emitted electrons are accelerated by the high voltage of the anode 8 and pass through the array 10 so as to be focussed in the form of the strip 14 on the anode or on the laser cavity (FIG. 9).

In a specific embodiment, the typical values of the voltages of the electrostatic screens are +300 to +600 V for electrodes 18a, 18b and −50 to −300 V for the electrodes 20a and 20b. These voltages can be in d.c. or pulsed form. They depend on the high voltage applied to the anode 8, the voltage applied to the grids 40 of the source and the distance between the anode and the source. They are optimized for a good strip focussing.

The total power P received by the anode and, in the particular case of the laser, by the cavity is greatly dependent on the focussing of the beam and more especially the width 1 of the exciting strip. For a given target of length L (FIG. 1) and for a useful electron density D, the power will be P=D.L.1. For a given accelerating voltage V applied to the anode, the electronic current I is defined by I=D.L.1/V.

NUMERICAL EXAMPLE

With V=10 kV, L=600 μm and D=2 kW/cm², we have:
 for 1=150 μm, P=1.8 W and I=180 μA; and
 for 1=10 μ, P=120 mW and I=12 μA.

These numerical values demonstrate that a good focussing, corresponding to the minimum strip width 1, makes it possible to:
 reduce the total power supplied by the gun and therefore simplify its cooling;
 tolerate higher exciting current densities (fixed by cathode voltages, grids and anodes), because for an equal power level it is possible to increase the electronic current density by a good focussing; and
 reduce to a significant extent the operating current and consequently there is less stressing of the microdots.

The height given off by the electron bombardment can then be easily dissipated by a thermal mass (system 32) supporting the anode and optionally having a cooling means of the Peltier element type.

Figure 3:
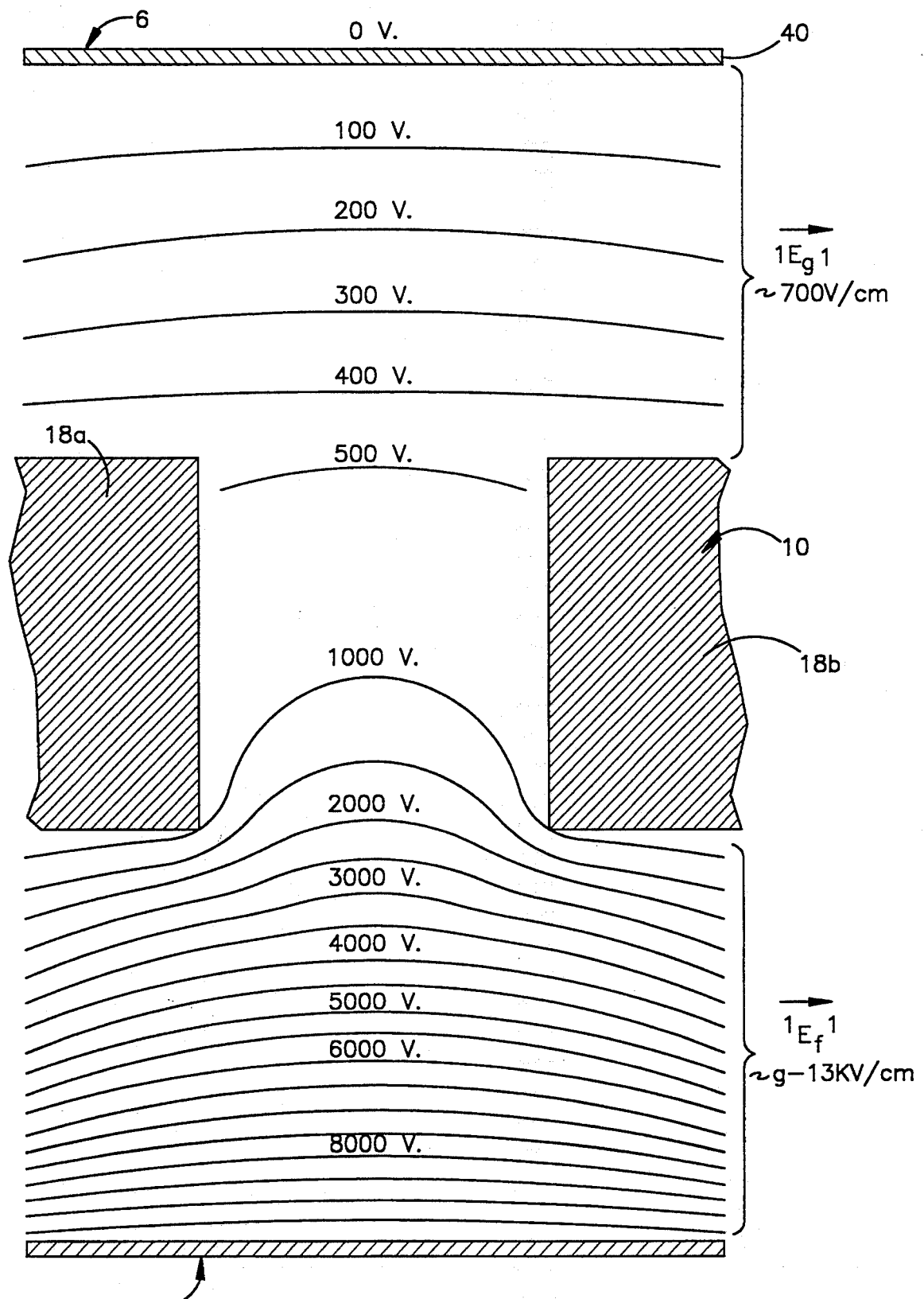
FIG. 3 A diagram showing the equipotential lines in the electron gun according to the invention.

FIG. 3 illustrates the subdivision into two electric field zones in the electron gun by means of the electrode array 10. The equipotential lines in FIG. 3 result from a numerical calculation. They were determined for grids 40 raised to a voltage of 0 V, an anode 8 raised to a voltage of 10 kV and electrodes 18a, 18b of the array 10 respectively raised to voltages of +500 V. The electrodes 20a, 20b are raised to a voltage of −100 V. The distance separating the grids from the anode is 20 mm. The electrodes have a height of 6 mm and the distance separating the anode from the electrodes is 7 mm.

This equipotential line distribution makes it possible to obtain a weak electrostatic field $E_f$ between the source 6 and the electrode array 10 of approximately 700 kV/cm and the obtaining of a strong electrostatic field $E_F$ of 9 to 13 kV/cm between the electrode array 10 and the anode 8.

Figure 4:
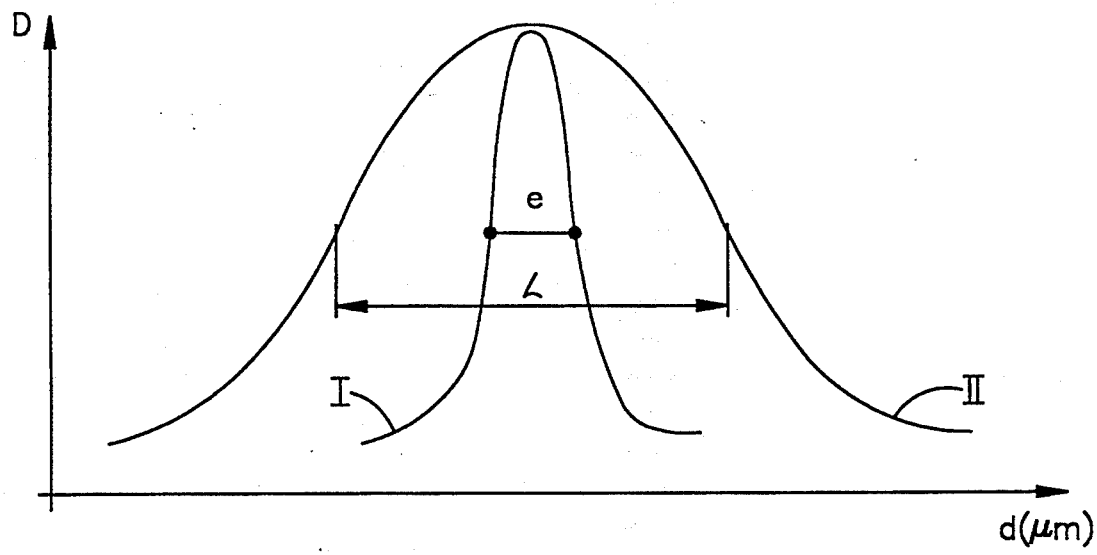
FIG. 4 Strip focussing profiles of the electron beam of the gun according to the invention.

FIG. 4 shows the electronic density variations D in arbitrary units, as a function of the dimensions d in um of the electron strip 14. The curve I gives the electronic density variations in a direction parallel to the strip width 1 and curve II gives the same variations in a direction parallel to the strip length L. The mid-height width of the profiles I and II respectively corresponds to the width and length of the strip.

For an array or network of rectangular microdots of $0.5 \times 1$ mm$^2$, source-electrode distances and electrode-anode distances of 6 mm, voltages on the electrodes 18a and 18b of +600 V and on the electrodes 20a and 20b of −100 V, an anode voltage of 10 kV, spacings between the electrodes 18a, 18b of 4 mm and electrodes 20a, 20b of 7 mm, a height of 6 mm for the electrodes 18a, 18b and 2.5 mm for the electrodes 20a, 20b and a planar anode, a focussing strip of approximately 100 to 150 um wide is obtained over a length of 600 μm.

Different practical embodiments of the electron gun according to the invention can be envisaged, as shown in FIGS. 5a to 8. The electrode array 10 only has two pairs of electrodes in the figs. Obviously, this is only an exemplified embodiment and it is possible to use three, four or more pairs of electrodes having different dimensions.

In the embodiment of FIGS. 5a to 5c, the source and the electrodes are placed on separated insulating supports, while in the embodiments of FIGS. 6a–6c and 7a–7c there is a hybrid arrangement.

In FIGS. 5a to 5c, the electrodes 18a, 18b, 20a, 20b are mounted on an electrically insulating disk 48, which for example is made from glass or a ceramic material (SiO$_2$, Al$_2$O$_3$), and is provided in its center with a hole 50 for the passage of the electron beam 12. The hole 50 is such that the facing parallel faces of the electrodes 28a, 28b and 30a, 30b project into the hole 50.

In this embodiment, there is another insulating disk 52, which for example is made of glass or ceramic, positioned parallel to the disk 48 and upstream of the latter and to which is fixed in particular by bonding the electron source 6. The cathodes 36 (FIG. 2) are manufactured either directly on said plate 52, or are bonded with their support 34 to the center of the plate 52.

Shims 54 placed on the periphery of the disks 48, 52 ensure a constant spacing between these two disks. These shims 54 are joined to the disks 48, 52 by bonding. In the same way, the electrodes 18a–18b are joined to the disk 48 by bonding.

Reference 56 indicates the microdot array of the source 6. The source 6 and the hole 50 of the disk 48 are aligned with the anode 8 in accordance with the axis 26.

In the embodiment shown in FIGS. 5a to 5c, the electrodes 18a, 18b, 20a, 20b are entirely metallic parts made from for example copper or molybdenum. In this case, the disks 48 and 52 have passages traversed by metal conductors 57 ensuring the connection of the electrodes and the source respectively to the power supplies 22, 24 and 38.

In the variants of FIGS. 6a to 7c, the source-electrode assembly is mounted on the same glass or ceramic insulating plate 58 having not shown metallizations for the electrical polarization of the different components of the electron gun.

Figure 6A:
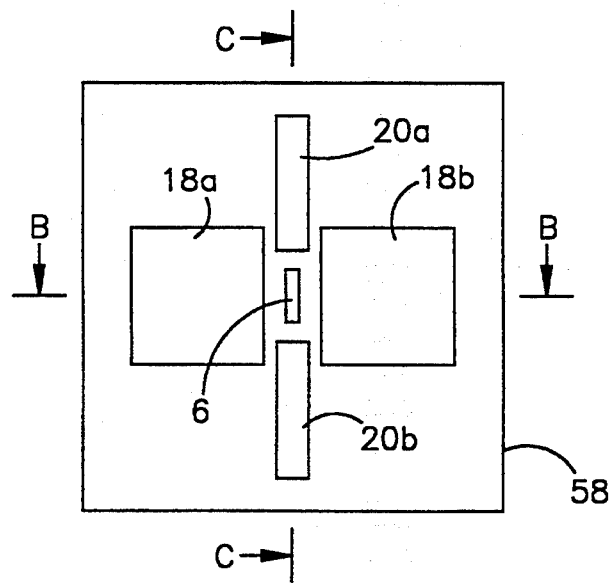
Figures 6B, 6C:
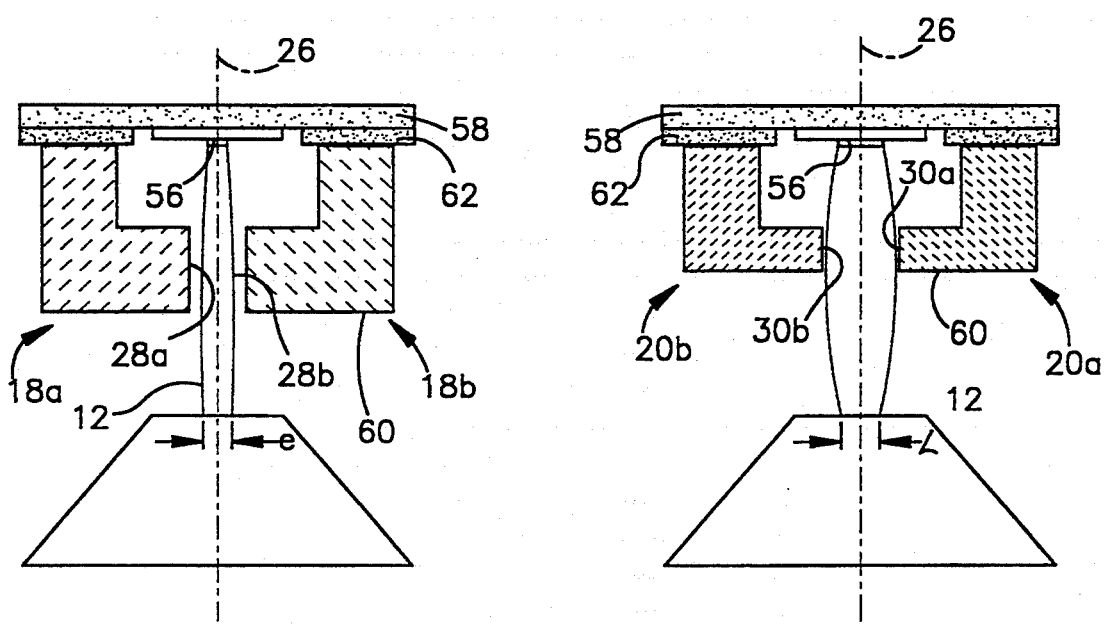

Moreover, in the variant of FIGS. 6a to 6c, the electrodes are constituted by ceramic insulating parts (SiO$_2$, Si$_3$N$_4$, . . . ) covered with a layer of metal 60, for example copper, gold or silver, deposited by vacuum evaporation.

This layer 60 can only be formed on those portions of the electrodes which face the electron beam 12 and the insulating support 58. Obviously, these electrodes could be entirely metallic, as in FIGS. 5a to 5c.

Figure 7A:
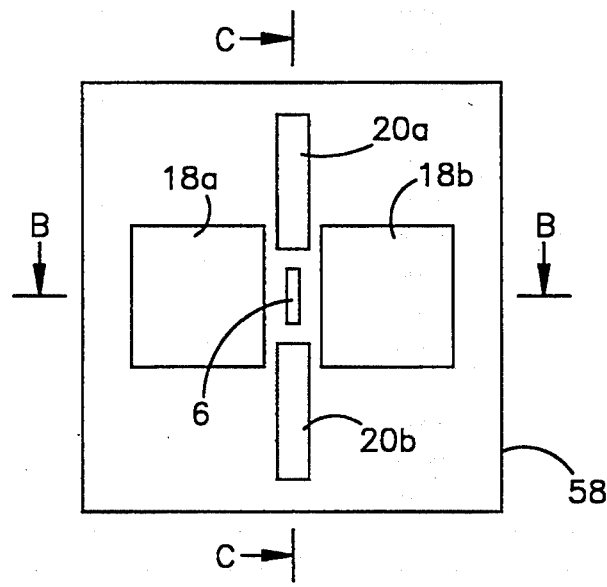
Figures 7B, 7C:
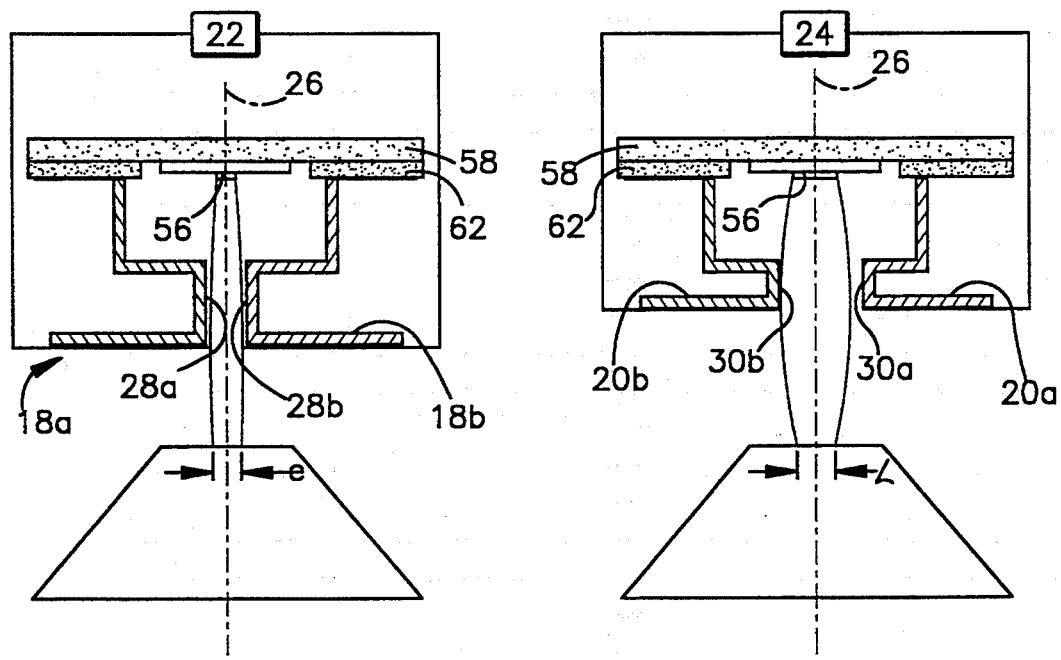

In the variant of FIGS. 7a to 7c, the electrodes are constituted by folded or bent metal plates without an insulating support.

Unlike in FIGS. 1, 5b and 5c, the electrodes of FIGS. 6a to 7c no longer are shaped like a rectangular parallelepiped. In section along a plane of symmetry passing through the axis 26 (planes of FIGS. 6b, 6c, 7b, 7c), they are shaped like an L, the free ends of each L-shaped electrode facing the electron beam. Thus, these ends have pairwise-parallel planar faces designated respectively 28a, 28b, 30a, 30b. The L-shaped electrodes are bonded to the insulating plate 58 around the microdot source 6 on not shown metallized tracks, which permit their electrical polarization.

Figure 8:
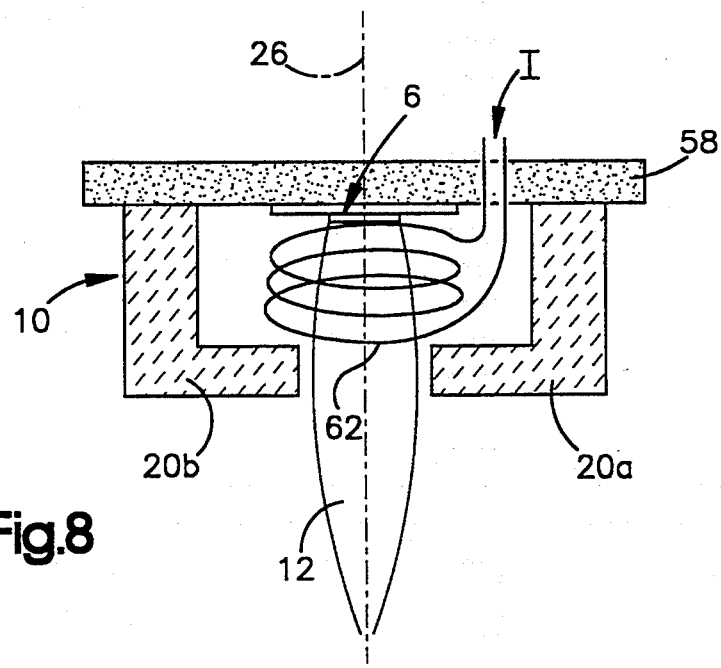
FIG. 8 In section a fourth variant of the gun according to the invention.

These electrodes can be directly formed on the insulating plate 58 (as shown in FIG. 8) or can be supported by a support 62 surrounding the substrate 34 of the source 6, as shown in FIGS. 6b/6c, 7a/7b.

The bonding or adhesion operations of the different insulating supports can be performed by an automatic machine of the type used in microelectronics for hybrid circuit assembly purposes. This automatic machine will also be responsible for the precise positioning of the different components of the electron gun and in particular the centring of the source with respect to the electrodes 18a, 18b, 20a, 20b along the axis 26.

In order to ensure a preliminary shaping of the electron beam, it is possible to associate with the electrode array 10 an electromagnetic lens, e.g. constituted in the manner shown in FIG. 8, by a conductive wire coil 62 traversed by a current I, said coil surrounding the electron beam 12. Thus, the longitudinal axis of symmetry of the coil is centred on the electron gun axis 26.

FIG. 8 is a sectional view of the electron gun in the same plane as that of FIGS. 6c and 7c.

Although the gun according to the invention can be used in a field other than that of lasers, it is perfectly appropriate for the electronic pumping of a semiconductor laser. Such a laser is diagrammatically represented in FIGS. 9a and 9b. This laser is a heterostructure laser, but it is obviously possible to use the electron gun according to the invention with other semiconductor laser types.

This laser has the electron gun 1 described hereinbefore associated with a laser cavity 70. This cavity (FIG. 9b) is in the form of a bar having two parallel faces 71, 73 obtained by cleaving and constituting the semireflecting mirrors of the laser cavity. These faces 71 and 73 are perpendicular to the surface of the different layers forming the cavity 70.

This cavity 70 has a substrate 72 on which has been epitaxied a buffer layer 74, a lower lateral light confinement layer 76, an active layer 78, an upper lateral light confinement layer 80 and an electronic excitation layer 82. Layer 82 is bombarded by the electron beam 12 focussed in the form of the strip 14.

The electron gun 1 and the laser cavity 70 are aligned so as to focus the electrons in accordance with a ribbon or strip 14, whose length is oriented perpendicular to the mirrors or cleaved faces 71, 73 of the laser cavity. The electron gun-laser cavity assembly is housed in the ultra-high vacuum enclosure 2 having windows 84 transparent to the light emitted by the laser structure.

Figure 9A:
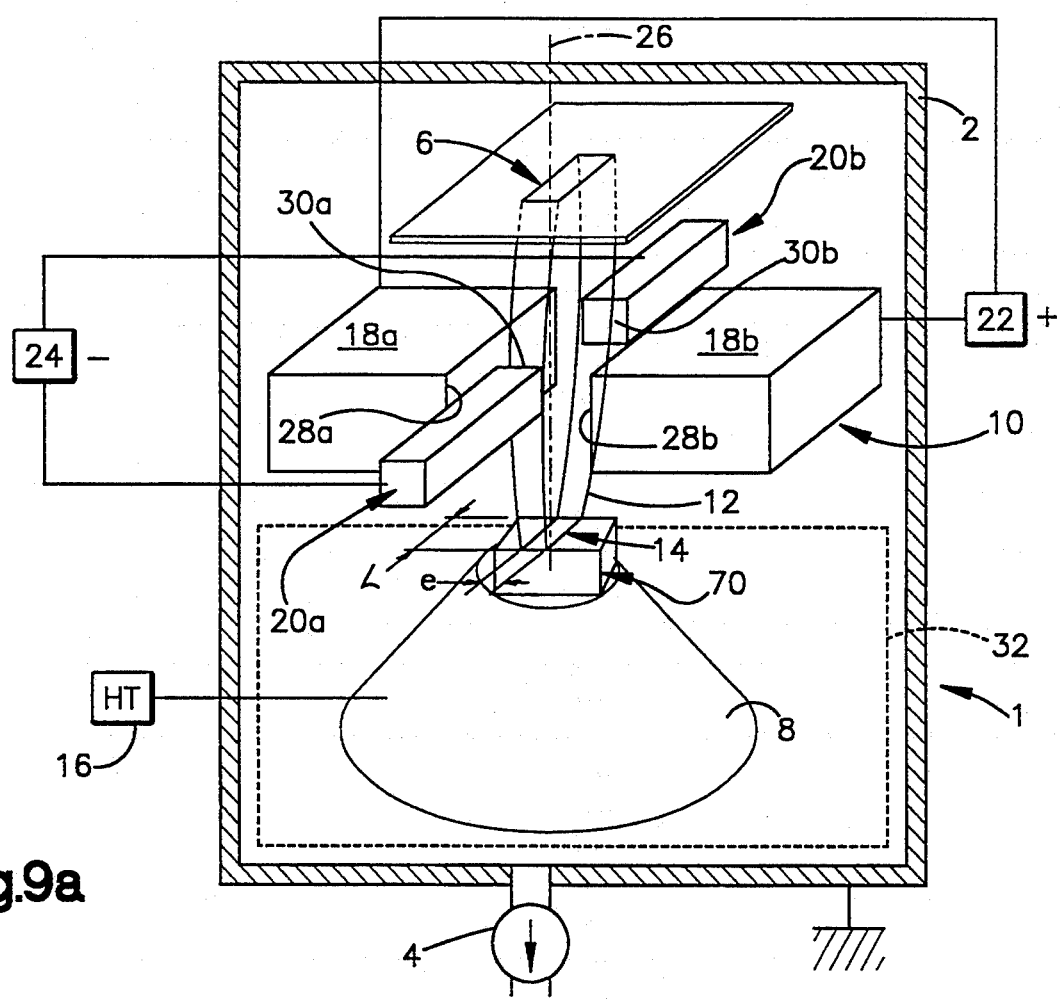
FIGS. 9a to 9b Diagrammatically a semiconductor laser having an electron gun and 9b according to the invention as the pumping means.
Figure 9B:
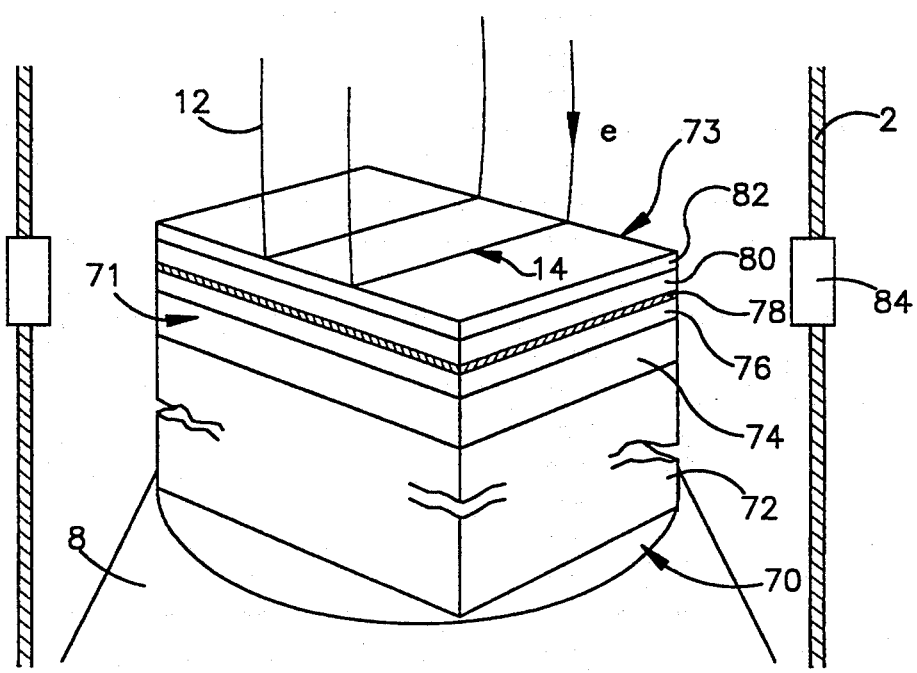

The laser shown in FIGS. 9a and 9b is in particular a heterostructure laser constituted by semiconductor layers of material II-VI. The semiconductor used is in particular $Cd_zMn_{1-z}Te$ with z varying between 0 and 1.

For example, the substrate has a Cd composition z of 1 and the buffer layer has a cadmium composition z of 0.75, the confinement layers 76 and 80 a cadmium composition z gradually varying from 0.75 to 0.85 starting from the substrate, the composition z of the active layer 78 being 1 and the cadmium composition z of the excitation layer gradually varying from 0.75 to 0.70 starting from the substrate.

Obviously, other II-VI semiconductors structures can be envisaged. In addition, the laser according to the invention can have a III-V material semiconductor structure, e.g. of $Ga_xAl_{1-x}As$ with x varying from 0 to 1.

We claim:

1. A compact electron gun comprising:
   a cold electron source (2) having a plurality of microdot cathodes for emitting an electron beam;
   a high voltage anode (8) spaced from and facing said microdot cathodes;
   means (16) for applying a high voltage to said anode;
   an array of electrodes (10) for focussing said electron beam emitted by said cold electron source onto said anode, said array being positioned between said cold electron source and said anode effective for electrostatically screening said cold electron source from the high voltage applied to the anode, said array having at least two pairs of electrodes (18a, 18b, 20a, 20b) of different dimensions distributed around said electron beam and respectively raised to positive and negative voltages for focussing said electron beam onto said anode in the form of a strip, said positive and negative voltages of said electrodes being such that a weak electrostatic field ($E_f$) is formed between said cold electron source and said array and that a strong electrostatic field ($E_F$) is formed between said array and said anode for maintaining said microdot cathodes in a weak electrostatic field zone to stabilize operation of said microdot cathodes;
   means (22, 24) for applying a medium voltage to said array;
   means (38) for applying an appropriate voltage to said microdot cathodes; and
   insulating supports for supporting said cold electron source and said array, said insulating supports of the cold electron source and of the array being separate.

2. The electron gun according to claim 1, wherein said array (10) has means (19a, 19b) for scanning the electron beam in a direction perpendicular thereto.

3. The electron gun according to claim 1 or 2, wherein said array also has electromagnetic circuit (62) traversed by a current surrounding the electron beam.

4. The electron gun according to claim 1, wherein said cold electron source has cathode conductors and grid electrodes perpendicular to said cathode conductors, said microdot cathodes are attached to said cathode conductors, and said grid electrodes (40) are raised to earth potential, are insulated from the cathode conductors and have holes (44) facing said microdot cathodes.

5. The electron gun according to claim 1, wherein said electrodes have a planar face (28a, 28b, 30a, 30b) facing the electron beam, the planar faces (28a, 28b) of the electrodes of one pair being perpendicular to the planar faces (30a, 30b) of the electrodes of another pair.

6. The electron gun according to claim 1, wherein said microdot cathodes (39) are arranged in a rectangular network.

7. The electron gun according to claim 1, wherein said anode (8) is frusto-conically shaped.

8. An electronically pumped semiconductor laser comprising a semiconductor laser cavity (70) and an electron gun (1) for producing an electron beam to excite said semiconductor laser cavity, said compact electron gun comprising a cold electron source having a plurality of microdot cathodes for emitting an electron beam, a high voltage anode spaced from and facing said microdot cathodes, means for applying a high voltage to said anode, an array of electrodes for focussing said electron beam emitted by said cold electron source onto said anode, said array being positioned between said cold electron source and said anode effective for electrostatically screening said cold electron source from the high voltage applied to the anode, said array having at least two pairs of electrodes of different dimensions distributed around said electron beam and respectively raised to positive and negative voltages for focussing said electron beam onto said anode in the form of a strip, said positive and negative voltages of said electrodes being such that a weak electrostatic field is formed between said cold electron source and said array and that a strong electrostatic field is formed between said array and said anode for maintaining said microdot cathodes in a weak electrostatic field zone to stabilize operation of said microdot cathodes, means for applying a medium voltage to said array, means for applying an appropriate voltage to said microdot cathodes, and insulating supports for supporting said cold electron source and said array, said insulating supports of the cold electron source and of the array being separate.

9. The laser according to claim 8, wherein said array is adapted for focussing said electron beam onto the anode in the form of a strip having a minimum width (1) and a length (L) equal to a length of said semiconductor laser cavity.

10. The laser according to claim 8 or 9, wherein said semiconductor laser cavity (70) consists of a semiconductor heterostructure.

11. The laser according to claim 8, wherein said semiconductor laser cavity (70) is made from II-VI materials.

* * * * *

UNITED STATES PATENT AND TRADEMARK OFFICE
CERTIFICATE OF CORRECTION

PATENT NO. : 5,440,579

DATED : August 8, 1995

INVENTOR(S) : Molva et al.

It is certified that error appears in the above-indentified patent and that said Letters Patent is hereby corrected as shown below:

On the title page, the following information should be inserted with respect to the assignee: --Commissariat A L'Energie Atomique, Paris Cedex, France--.

On the face of the patent, the following information should be inserted with respect to the Attorney, Agent or Firm: --Pearne, Gordon, McCoy & Granger--.

On the face of the patent, in the Abstract, line 6, delete "and," and insert --anode, and an--.

Column 3, line 42, delete "are" and insert --and--.

Column 4, line 64, after "electron" insert --beam.--.

Column 5, line 60, delete "and 9b".

Column 6, line 38, delete "sane" and insert --same--;
          line 45, delete "bean" and insert --beam--;
          line 56, delete "bean" and insert --beam--;
          line 57, delete "bean" and insert --beam--;
          line 60, delete "sane" and insert --same--; and
          line 67, delete "bean" and insert --beam--.

UNITED STATES PATENT AND TRADEMARK OFFICE
CERTIFICATE OF CORRECTION

PATENT NO. : 5,440,579

DATED : August 8, 1995

INVENTOR(S) : Molva et al.

It is certified that error appears in the above-indentified patent and that said Letters Patent is hereby corrected as shown below:

```
Column 7, line 7, delete "bean" and insert --beam--;
         line 9, delete "bean" and insert --beam--; and
         line 17, delete "deflect mg" and insert
         --deflecting--.
```

Signed and Sealed this

Thirtieth Day of April, 1996

Attest:

BRUCE LEHMAN

Attesting Officer

Commissioner of Patents and Trademarks